(12) United States Patent
Wylie

(10) Patent No.: US 6,444,536 B2
(45) Date of Patent: *Sep. 3, 2002

(54) METHOD FOR FABRICATING BIPOLAR TRANSISTORS

(75) Inventor: Ian Wakefield Wylie, Greenwich, NJ (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/349,538

(22) Filed: Jul. 8, 1999

(51) Int. Cl.[7] ............................................ H01L 21/331
(52) U.S. Cl. ........................ 438/341; 438/321; 438/343; 438/345
(58) Field of Search ................................ 438/655, 374, 438/366, 365, 348, 341, 310, 309, 234, 321, 343, 345; 257/754, 592, 525, 383, 362

(56) References Cited

U.S. PATENT DOCUMENTS

| 3,997,367 A | * | 12/1976 | Yau ............................ 438/374 |
|---|---|---|---|
| 4,309,812 A | * | 1/1982 | Horng et al. ................ 438/374 |
| 4,824,799 A | * | 4/1989 | Komatsu ..................... 438/348 |
| 4,829,015 A | * | 5/1989 | Schaber et al. ............. 438/348 |
| 5,059,544 A | * | 10/1991 | Burghartz et al. .......... 438/341 |
| 5,100,812 A | * | 3/1992 | Yamada et al. ............. 438/365 |
| 5,118,634 A | * | 6/1992 | Neudeck et al. ............ 438/341 |
| 5,229,307 A | * | 7/1993 | Vora et al. .................. 438/234 |
| 5,320,972 A | * | 6/1994 | Wylie ......................... 438/366 |
| 5,428,243 A | | 6/1995 | Wylie |
| 5,482,874 A | * | 1/1996 | Ganschow ................... 438/345 |
| 5,516,710 A | * | 5/1996 | Boyd et al. ................. 438/309 |
| 5,747,374 A | * | 5/1998 | Jeon ........................... 438/309 |
| 5,760,458 A | * | 6/1998 | Bergemont et al. ......... 257/588 |
| 5,882,976 A | * | 3/1999 | Blair .......................... 438/309 |
| 6,020,246 A | * | 2/2000 | Koscielniak et al. ........ 438/341 |

* cited by examiner

Primary Examiner—Eddie Lee
Assistant Examiner—José R Diaz
(74) Attorney, Agent, or Firm—Lowenstein Sandler PC

(57) ABSTRACT

In accordance with the invention, a bipolar transistor is fabricated by disposing a sacrificial layer over the conventional semiconductor workpiece. The sacrificial layer is patterned into a stripe corresponding to the emitter stripe, and the base contacts are formed in relation to the sacrificial stripe. The stripe is removed, and the base and emitter are formed. In the preferred embodiment, the sacrificial layer is a stack of layers providing etch selectivity.

9 Claims, 7 Drawing Sheets

FIG. 1

| | |
|---|---|
| PROVIDE WORKPIECE | A |
| DEPOSIT SACRIFICIAL LAYER | B |
| PATTERN SACRIFICIAL LAYER | C |
| IMPLANT LINK REGION | D |
| FORM SIDEWALL SPACER | E |
| FORM BASE CONTACT POLY LAYER | F |
| PLANARIZE WORKPIECE | G |
| OXIDIZE BASE POLY | H |
| REMOVE SACRIFICIAL NITRIDE & IMPLANT BASE | I |
| DEPOSIT AND DOPE EMITTER | J |
| FINISH TRANSISTER | K |

METHOD FOR FABRICATING BIPOLAR TRANSISTORS

FIELD OF THE INVENTION

This invention relates to bipolar transistors, and, in particular, to an improved method for fabricating bipolar transistors such as double polysilicon bipolar transistors.

BACKGROUND OF THE INVENTION

Double polysilicon bipolar transistors are important components on many applications. Such devices are used, for example, in high speed, low power amplifiers for wireless communication systems and in other high end applications.

A bipolar transistor (sometimes referred to as a "double poly" transistor) is formed with two layers of polysilicon: a first polysilicon layer for base electrodes and a second polysilicon layer for the emitter electrode. The advantage of using polysilicon, rather than single crystal silicon, is self-alignment of the emitter, improved forward current gain, reduced collector-base parasitic capacitance and reduced spacing between the emitter and base electrodes. Double polysilicon bipolar transistors and methods for making them are described in detail in applicant's U.S. Pat. No. 5,428,243 issued Jun. 27, 1995 and entitled "Bipolar Transistor With A Self-Aligned Heavily Doped Collector Region and Base Link Regions" and U.S. Pat. No. 5,320,972 issued Jun. 14, 1994 and entitled "Method of Forming a Bipolar Transistor", which are incorporated herein by reference. Related structures and methods are described in H. K. Park et al., "High Speed Polysilicon Emitter-Base Bipolar Transistor", IEEE Electron Device Letters, EDL-7, No. 12 (December 1986).

An often used method for making double polysilicon bipolar transistors is that described in the U.S. Pat. No. 5,428,243 patent. In essence, a semiconductor workpiece is formed comprising a stack of N-doped polysilicon layers topped by patterned field oxide isolation regions. The stack includes a heavily doped buried layer overlaid by a lightly doped epitaxial layer including a device well region.

A relatively thick sacrificial layer of silicon dioxide (~1500 angstroms) is deposited on the workpiece and patterned for opening a minimum dimension space wherein the emitter stripe is to be formed.

Subsequent to patterning the emitter stripe, an etch is performed to remove both the oxide and a portion of the underlying doped polysilicon. This etch, which is carried out without an etch stop, extends into the collector layer. The etch can produce a significant and undesirable trench in the underlying collector.

After the etch, a "link implant" is implanted into the open stripe, and a sidewall spacer of dielectric material is formed against the walls of the opening that will ultimately isolate the emittter from the base contacts.

An intrinsic base is then implanted into the reduced size open stripe, and the emitter material is deposited into the open stripe. A transistor can now be formed by activating the implants and metallizing the active regions.

While this now conventional process has worked well for many applications, it does present problems and can be improved. One problem is the trenching of the exposed emitter strip during removal of the base polysilicon. Another problem is that the link implant, which electrically connects the intrinsic base region of the transistor to the base contact region, cannot be more heavily doped than the intrinsic region. This introduces additional base contact resistance. Thirdly, the conventional process is not well adapted for integration into a process which also includes fabrication of CMOS transistors (a "BICMOS" process). Accordingly, there is a need for an improved process for fabricating double polysilicon bipolar transistors.

SUMMARY OF THE INVENTION

In accordance with the invention, a bipolar transistor is fabricated by disposing a sacrificial layer over the conventional semiconductor workpiece. The sacrificial layer is patterned into a stripe corresponding to the emitter stripe, and the base contacts are formed in relation to the sacrificial stripe. The stripe is removed, and the base and emitter are formed. In the preferred embodiment, the sacrificial layer is a stack of layers providing etch selectivity.

BRIEF DESCRIPTION OF THE DRAWINGS

The nature, advantages and various additional features of the invention will appear more fully upon consideration of the illustrative embodiments now to be described in detail in connection with the accompanying drawings. In the drawings FIG. 1 is a schematic flow diagram of the steps in making a double polysilicon bipolar transistor in accordance with the invention.

It is to be understood that these drawings are for purposes of illustrating the concepts of the invention and are not to scale. The same reference numbers are used for similar elements throughout the drawings.

DETAILED DESCRIPTION

Figure 2:
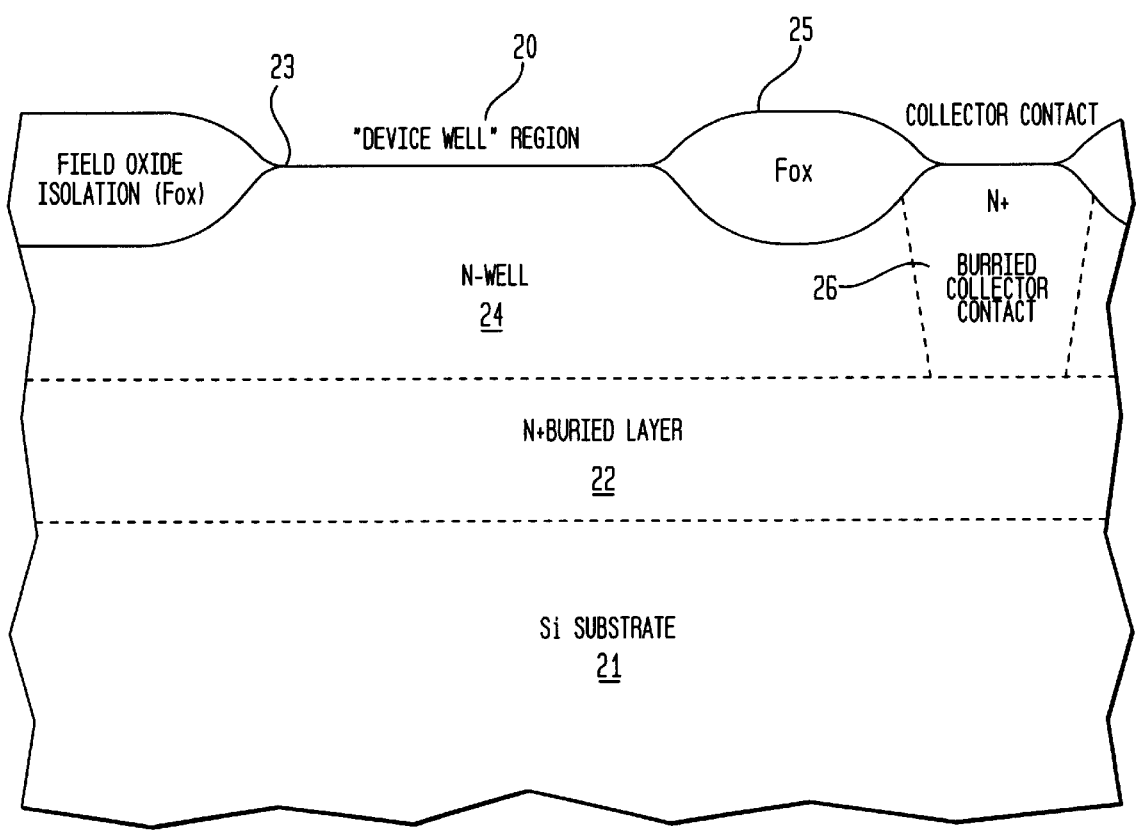
FIGS. 2–12 are schematic cross sections of the workpiece at various stages of the process of FIG. 1.

In essence, the inventive method for making a bipolar transistor comprises providing a semiconductor substrate comprising a doped buried layer, a doped epitaxial layer overlying the buried layer, a device well region of a first conductivity type and isolation regions overlying the epitaxial layer. A sacrificial layer, such as silicon nitride, with etch selectivity to the underlying silicon is formed on the workpiece, and the sacrifical layer is patterned into a region in the form of an emitter stripe and a mask for subsequent deposition of the base conductive layer i.e. the nitride layer can be patterned so that it remains in the region that is to become the emitter stripe and in regions where the base conductive layer is to be excluded. The base contacts of a second conductivity type are formed using the sacrificial emitter stripe as a mask, and then the sacrificial emitter stripe is removed. The base and the emitter of the second and first conductivity types, respectively, are formed and the transistor is finished.

Referring to the drawings, FIG. 1 is a schematic flow diagram showing the steps in a preferred implementation of this method in making a double polysilicon bipolar transistor. The first step shown in block A of FIG. 1 is to provide a silicon workpiece comprising a heavily doped (N$^+$) buried silicon layer overlaid by a lightly doped (N$^-$) epitaxial silicon layer including a device well region. Field oxide isolation regions overlie the epitaxial layer.

FIG. 2 illustrates a typical such workpiece 20 comprising a silicon wafer 21 having a heavily doped buried layer 22 overlaid by a lightly doped layer 23 of epitaxial silicon in which a device well region 24 is defined. Field oxide isolation regions 25 overlay layer 23, and an N$^+$ region 26 (typically $10^{20}$ cm$^{-3}$) is provided for contacting the buried layer 22.

The layers 22 and 23 can be conventionally formed as by epitaxial growth or MeV ion implantation. Buried layer 22 is typically $N^+$ type silicon doped with As or Sb (approximately $1\times10^{19}$ cm$^{-3}$). Layer 23 can be lightly N doped (typically $5\times10^{15}$ cm$^{-3}$). The well region 24 can be formed by surrounding implantation with N type ions (typical dose: $\sim2\times10^{16}$ cm$^{-2}$). The implant is excluded from the device well region 24 in which the bipolar transistor is to be formed. Field isolation regions 25 are formed, for example, by the recessed field oxide process.

Figure 3:
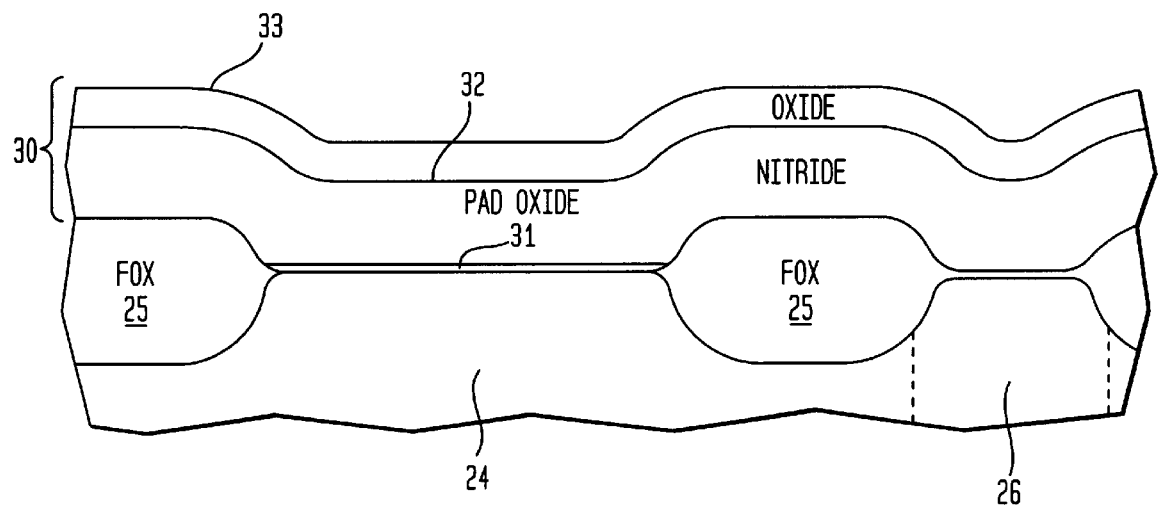

The next step shown in Block B of FIG. 1 is to grow or deposit on the workpiece 20 a sacrificial layer advantageously in the form of a stack of materials with etch selectivity to the underlying silicon. This preferably involves growing or depositing a thin layer of silicon oxide (typically about 100–150 angstroms), depositing a thick layer of silicon nitride (about 3000 angstroms) and depositing a top layer of silicon dioxide (about 1000 angstroms). FIG. 3 shows the resulting structure including the sacrificial stack 30 comprising a thin oxide layer 31, nitride layer 32 and top oxide 33.

Figure 4:
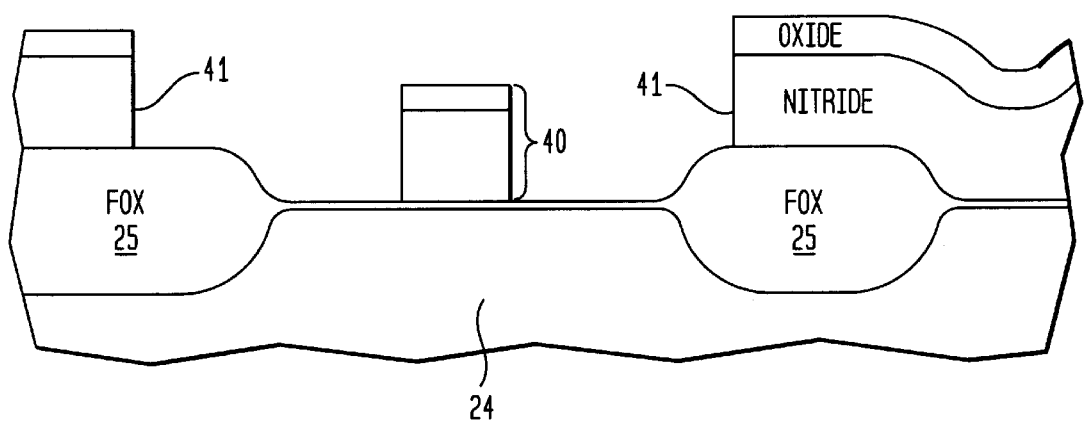

The third step (Block C) is to pattern portions of the sacrificial layer 30 into the form of the emitter stripe and a mask for subsequent deposition of the base polysilicon, i.e. the top layer 33 and nitride layer 32 are left only in the region that is to become the emitter stripe and in regions where the base polysilicon layer is to be excluded. The thin oxide layer 31 is not etched. This patterning and selective etching can be done using standard photolithography and plasma etch techniques. FIG. 4 illustrates the structure after etching, showing the portion 40 of the stack corresponding to the emitter stripe and other portions 41 to exclude base polysilicon.

Figure 5:
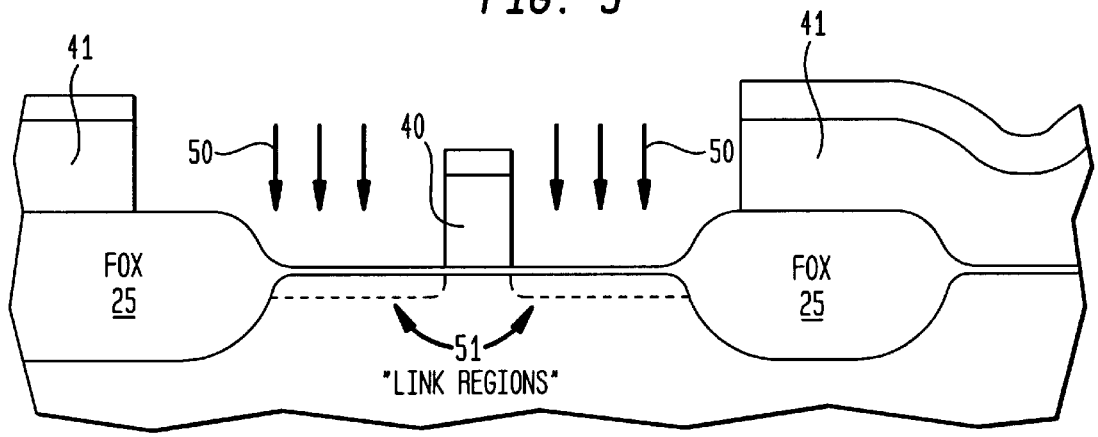

The next step, shown in Block D of FIG. 1 is to implant the link region of the device using the patterned sacrificial stack as a self-aligned implant barrier. The link implant is a deep implant of a relatively light dose of P dopant, e.g. a 50 KeV implant of $1\times10^{14}$ cm$^{-2}$ Boron. The function of the link implant is to minimize parasitic base sheet resistance and to maximize emitter-base breakdown voltage. The implant can be optimized to trade off these parameters. FIG. 5 shows the structure during the link implant wherein Boron ions 50 are implanted into the link regions 51 not masked by sacrificial layer portions 40, 41.

It would be possible to combine the link implant with an implant to connect a PMOS transistor channel doping region to a PMOS contact region by reducing the depth of the link implant, e.g. $5\times10^{13}$ cm$^{-2}$ Boron at 20 KeV for a NPN and a PMOS LDD.

Figure 6:
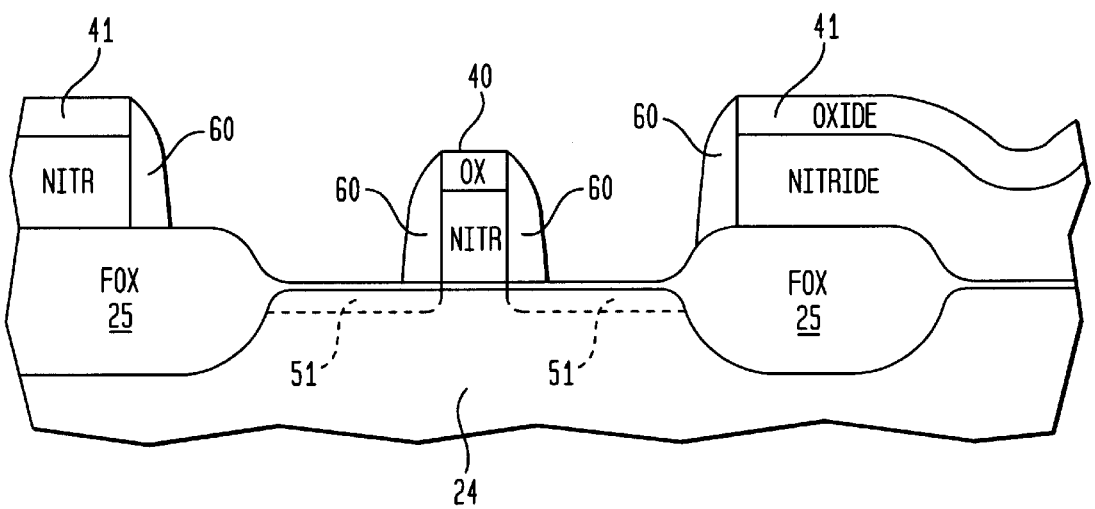

The fifth step (Block E) is to form sidewall spacers on the walls of the patterned sacrificial layer regions 40, 41. The spacers can be formed by depositing a layer of silicon oxide (1500–2500 angstroms) and etching it to form the spacers around the stack regions. FIG. 6 illustrates the resulting structure showing the spacers 60 on the walls of the sacrificial stack regions. The sacrificial oxide layer 31 is typically removed during sidewall spacer formation or it can be removed separately by a wet or dry etch.

At this point, an optional step (not shown in FIG. 1) is to form a high surface concentration in the contact regions as by implanting a relatively high dose of Boron into the exposed base contact regions (typically $2\times10^{15}$ cm$^{-2}$ B at 10 KeV).

The next step shown in Block F is to deposit and dope the base contact polysilicon layer. As a preliminary step, the sacrificial oxide layer 31 can be removed as by wet etching.

Figure 7:
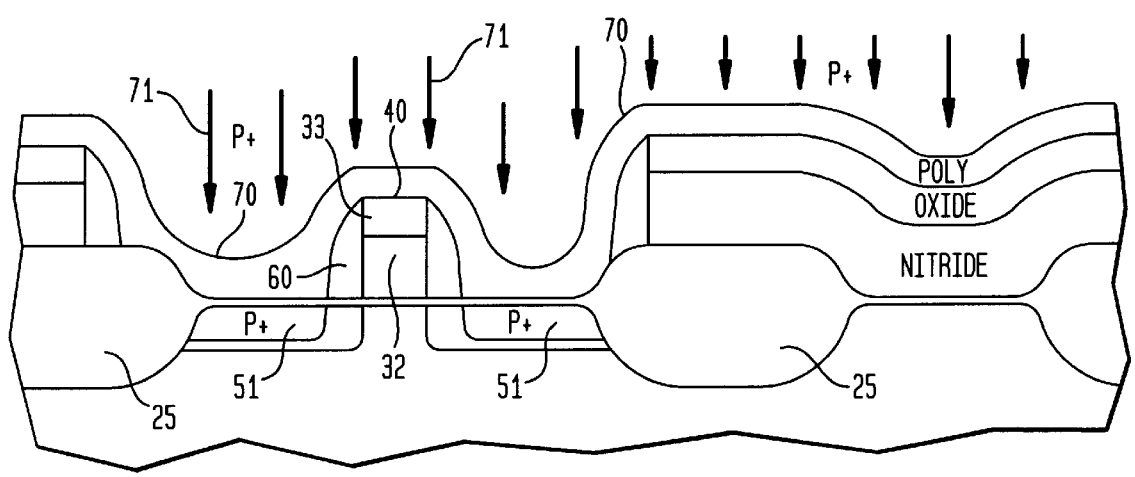

Typically a layer of polysilicon approximately 2000 angstroms thick is deposited and P-doped by implanting $2\times10^{15}$ cm$^{-2}$ of Boron at 5 KeV. FIG. 7 shows the base contact polysilicon layer 70 deposited on the workpiece and being implanted with P dopant ions 71.

Figure 8:
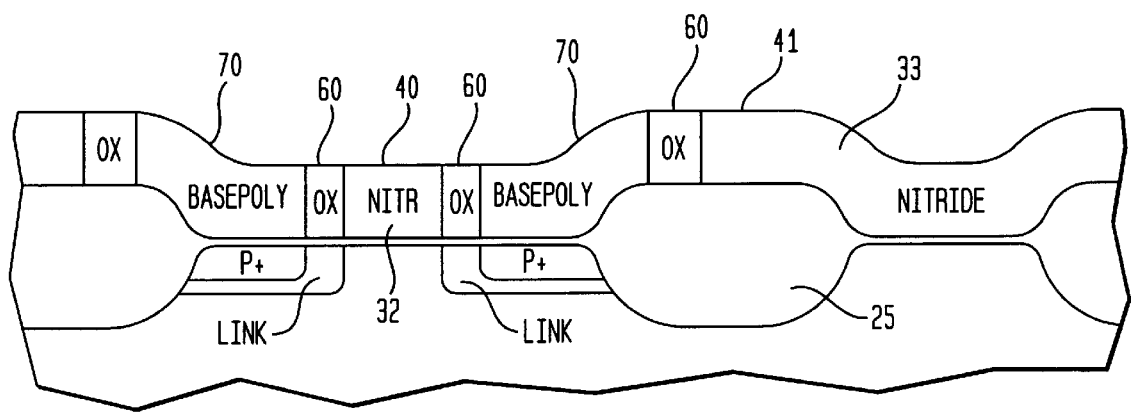

The seventh step (Block G) is to planarize the workpiece to remove the base contact polysilicon over the sacrificial regions 40, 41. Advantageously planarization removes the top layer of oxide 33 of the sacrificial stack. This step can be conveniently carried out by Chemical Mechanical Polishing (CMP). In the CMP process, the nitride portion of the sacrificial regions acts as an etch stop. FIG. 8 illustrates the workpiece after planarization. The base contact polysilicon 70 remains in regions where sacrificial stack regions 40, 41 were not present.

Figure 9:
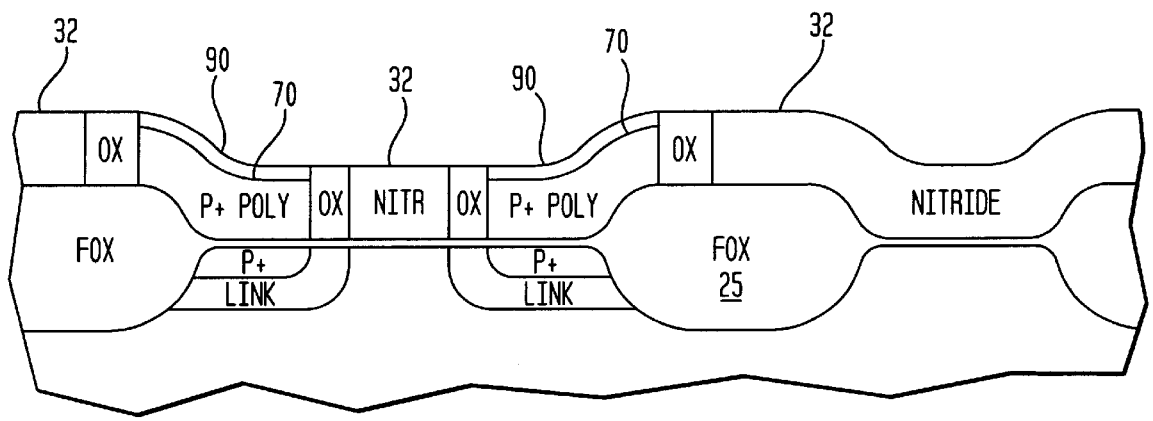

The next step (FIG. 1, Block H) is to form a dielectric layer on the exposed surface of the base contact polysilicon, as by growing a layer of silicon oxide (thickness typically 300 angstroms). This layer isolates the base contact from the emitter contact and simplifies subsequent processing of the emitter contact, allowing misalignment overlap of the emitter polysilicon on top of the base polysilicon without producing an emitter-base short. FIG. 9 shows the grown oxide layer 90 on top of the base contact polysilicon 70.

Figure 10:
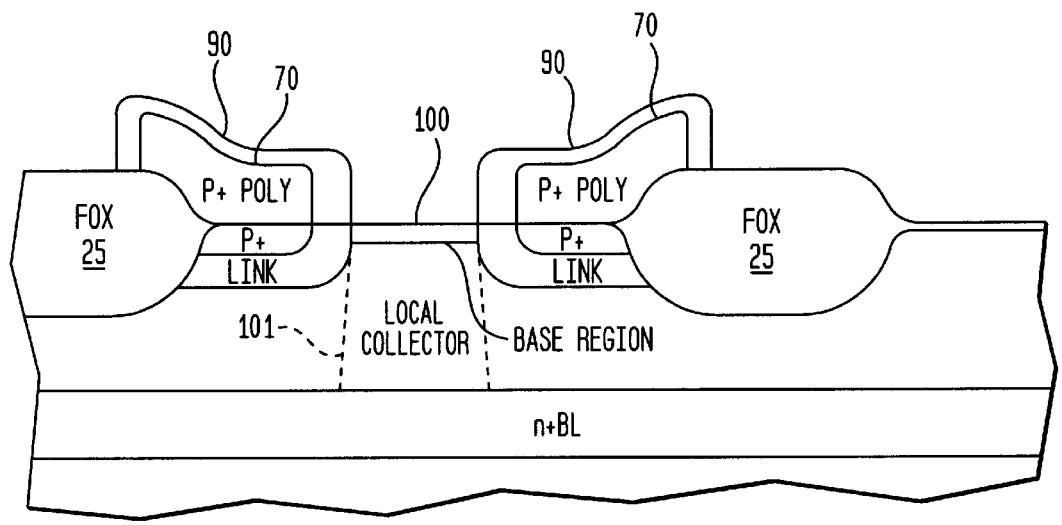

The ninth step (Block I) is to remove the sacrificial regions overlying the base regions and implanting the base. In the preferred embodiment this step involves removing the nitride layer 32 of the patterned sacrificial stack regions 40, 41 and implanting the base. The nitride layer can be removed by etching with phosphoric acid. After etching, the emitter contact region is exposed. The base can be implanted into this exposed emitter region. The base contacts operate as self-aligned implant stops. Typical conditions are $1\times10^{13}$ cm$^{-2}$ Boron at 10 KeV. Advantageously, the same exposed region is also subjected to an optional self-aligned collector implant in order to reduce collector resistance. Typical conditions are $2\times10^{12}$ cm$^{-2}$ phosphorous at 180 KeV. FIG. 10 shows the workpiece after removal of the nitride layer 32, implantation of the base region 100, and an optional local collector implant 101.

Figure 11:
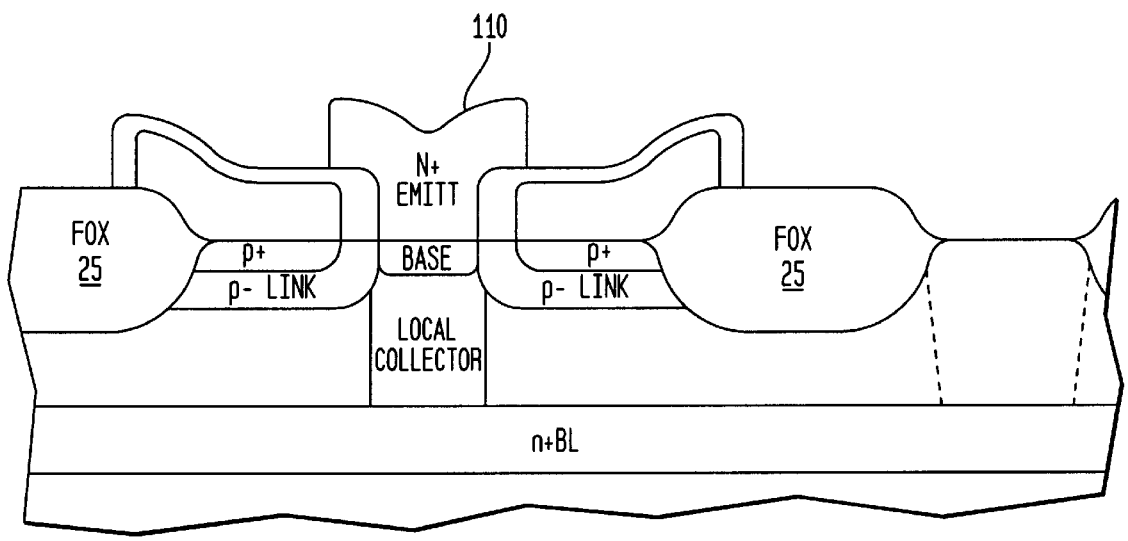

Now the emitter contact polysilicon can be deposited, doped and patterned (Block J). This step can be effected by depositing polysilicon, $N^+$ doping it by implantation and patterning the deposited polysilicon to form the emitter region. Typical thickness is 2500 angstroms. Typical implantation conditions are $1\times10^{16}$ cm$^{-2}$ Arsenic at 50 KeV. The patterning advantageously leaves polysilicon only in the emitter contact area with a small overlap to allow alignment of metal contacts on top of the emitter contact stripe. FIG. 11 shows the workpiece with the doped, patterned emitter contact 110.

Figure 12:
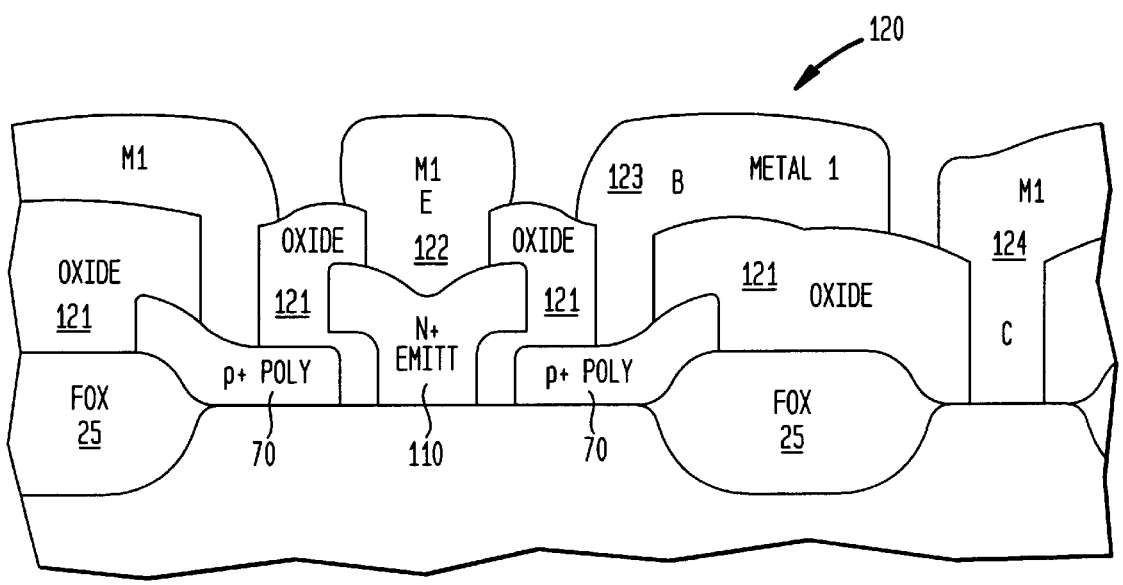

The transistor is then finished in the conventional manner (Block K). Standard thermal processing is executed to activate the implants. Contact formation, planarization, metallization and passivation are carried out according to industry standard methods. FIG. 12 illustrates a typical resulting transistor 120 with regions of passivating oxide 121 applied over the workpiece, and metal contacts 122, 123 and 124 to the emitter, base and collector, respectively.

The process of FIG. 1 eliminates trenching of the emitter stripe. Base contact polysilicon is not deposited in contact with the emitter and is later removed during planarization, protecting the critical emitter surface. See FIGS. 7 and 8. The sacrificial nitride layer temporarily residing in the emitter stripe space can be removed with high selectivity. The base contact resistance can be reduced by the optional base contact implant referred in the fifth step. And the process can be easily adapted to include fabrication of CMOS transistors because the sacrificial nitride oxide stack covers and protects any previously fabricated CMOS devices. The oxidation and activation of the base and emitter implants could also be used as the activation for CMOS implants.

It is to be understood that the above-described embodiments are illustrative of only a few of the many possible specific embodiments which can represent applications of the principles of the invention. For example, while a NPN process has been described herein, a corresponding PNP process employing the principles of the invention could be easily carried out by those skilled in art. Numerous and varied minor modifications can be readily devised by those skilled in the art without departing from the spirit and scope of the invention.

What is claimed:

1. A method for making a double polysilicon bipolar transistor including an emitter having the form of a stripe, a base, a polysilicon base conductive layer, and a polysilicon emitter contact comprising the steps of:
   A. providing a workpiece comprising a silicon substrate including a doped buried layer, a doped epitaxial layer overlying the buried layer, a device well region and isolation regions overlying the doped epitaxial layer;
   B. forming on the workpiece a sacrificial layer with etch selectivity to the underlying silicon substrate;
   C. patterning the sacrificial layer into a patterned sacrificial layer including the form of an emitter stripe and a mask for subsequent deposition of the polysilicon base conductive layer;
   D. implanting a link region using the patterned sacrificial layer as a self-aligned implant barrier;
   E. forming sidewall spacers on the walls of the patterned sacrificial layer;
   F. depositing a polysilicon base conductive layer using the patterned sacrificial layer as a mask;
   G. planarizing the workpiece to remove the polysilicon base conductive layer overlying the patterned sacrificial layer;
   H. forming a dielectric layer on the polysilicon base conductive layer;
   I. removing the patterned sacrificial layer and implanting the base in the substrate; and
   J. forming the polysilicon emitter contact.

2. The method of claim 1 wherein step B comprises growing or depositing on the workpiece a sacrificial stack of layers comprising a layer of silicon oxide, a layer of silicon nitride and a top layer of silicon oxide.

3. The method of claim 2 wherein step C comprising patterning the sacrificial stack of layers so that the top layer of silicon oxide and the layer of silicon nitride remain in the form of the emitter stripe and where the polysilicon base conductive layer is to be excluded.

4. The method of claim 3 wherein step I comprises etching the nitride layer of the patterned sacrificial stack to expose the workpiece and implanting the base into the workpiece using the polysilicon base conductive layer as self-aligned implant stops.

5. The method of claim 1 wherein step E comprises depositing a layer of silicon oxide and etching it to form the sidewall spacers.

6. The method of claim 1 wherein the double polysilicon bipolar transistor includes a base contact region in the workpiece upon which the polysilicon base conductive layer is to be formed and comprising the additional after step E of implanting impurities into the base contact region to form a surface concentration of impurities.

7. The method of claim 1 wherein the double polysilicon bipolar transistor includes a base contact region on the workpiece and step F comprises removing the sacrificial layer over the base contact region, depositing the polysilicon base conductive layer and doping the deposited polysilicon base conductive layer.

8. The method of claim 1 wherein step G comprises chemical mechanical polishing the workpiece.

9. The method of claim 1 wherein step H comprises growing a layer of silicon oxide on the polysilicon base conductive layer.

* * * * *